United States Patent
de Souza et al.

(10) Patent No.: US 9,984,949 B1
(45) Date of Patent: May 29, 2018

(54) SURFACE PASSIVATION HAVING REDUCED INTERFACE DEFECT DENSITY

(71) Applicant: International Business Machines Corporation, Armonk, NY (US)

(72) Inventors: Joel P. de Souza, Putnam Valley, NY (US); Yun Seog Lee, White Plains, NY (US); Kunal Mukherjee, Goleta, CA (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/404,462

(22) Filed: Jan. 12, 2017

(51) Int. Cl.
*H01L 23/29* (2006.01)
*H01L 23/31* (2006.01)
*H01L 21/02* (2006.01)
*H01L 29/20* (2006.01)
(Continued)

(52) U.S. Cl.
CPC ...... *H01L 23/3171* (2013.01); *H01L 21/0206* (2013.01); *H01L 21/02112* (2013.01); *H01L 21/02359* (2013.01); *H01L 21/02362* (2013.01); *H01L 23/29* (2013.01); *H01L 23/291* (2013.01); *H01L 23/298* (2013.01); *H01L 23/3135* (2013.01); *H01L 23/3192* (2013.01); *H01L 29/20* (2013.01); *H01L 29/408* (2013.01); *H01L 29/513* (2013.01); *H01L 29/517* (2013.01)

(58) Field of Classification Search
CPC ........... H01L 23/3171; H01L 21/02112; H01L 21/02359; H01L 21/02362; H01L 23/29; H01L 23/3135; H01L 23/3192; H01L 29/408
See application file for complete search history.

(56) References Cited

U.S. PATENT DOCUMENTS

| 6,380,097 B1 | 4/2002 | Dauplaise et al. |
| 2002/0182840 A1 | 12/2002 | Lorans et al. |
| 2009/0042344 A1 | 2/2009 | Ye et al. |

(Continued)

FOREIGN PATENT DOCUMENTS

RU 2402103 C1 10/2010

OTHER PUBLICATIONS

Jackson et al. "Reduction of the potential energy barrier and resistance at wafer-bonded n-GaAs/n-GaAs interfaces by sulfur passivation," Journal of Applied Physics 110, 104903 (2011); http://dx.doi.org/10.1063/1.3662144, 7 pages.

Khader et al. "Formation of arsenic sulfide on GaAs surface under illumination in acidified thiourea electrolytes," Applied Surface Science 258, (2011), pp. 68-75.

Rabah et al. "Study of GaAs chemical etching in a mixture of hydrogen peroxide/succinic acid and ammonia. Thiourea effect on the surface roughness and on the presence of surface states after etching," Applied Surface Science, 171 (2001), pp. 34-43.

(Continued)

*Primary Examiner* — Fei Fei Yeung Lopez
(74) *Attorney, Agent, or Firm* — Cantor Colburn LLP

(57) ABSTRACT

Embodiments are directed to a method of passivating a surface of a high-mobility semiconductor and resulting structures having a reduced interface defect density. A semiconductor layer is formed on a substrate. A surface of the semiconductor layer is contacted with a sulfur source including thiourea at a temperature of up to about 90 degrees Celsius to form a sulfur passivation layer on the surface of the semiconductor layer. A dielectric layer is formed on the sulfur passivation layer and a minimum of interface trap density distribution at an interface between the semiconductor layer and the dielectric layer is less than about $2.0 \times 10^{11}$ cm$^{-2}$ eV$^{-1}$.

16 Claims, 6 Drawing Sheets

(51) Int. Cl.
*H01L 29/40* (2006.01)
*H01L 29/51* (2006.01)

(56) References Cited

U.S. PATENT DOCUMENTS

| | | |
|---|---|---|
| 2011/0089469 A1 | 4/2011 | Merckling |
| 2014/0027884 A1* | 1/2014 | Tang .................... H01L 23/293 |
| | | 257/632 |
| 2015/0118834 A1 | 4/2015 | Loh et al. |
| 2016/0013048 A1 | 1/2016 | Gaylord et al. |

OTHER PUBLICATIONS

List of IBM Patents or Patent Applications Treated as Related (Appendix P); Filed Jan. 12, 2016, 2 pages.

Joel P. de Souza, et al. "Surface Passivation Having Reduced Interface Defect Density," U.S. Appl. No. 15/815,991, filed Nov. 17, 2017.

Joel P. de Souza, et al. "Surface Passivation Having Reduced Interface Defect Density," U.S. Appl. No. 15/815,997, filed Nov. 17, 2017.

* cited by examiner

SURFACE PASSIVATION HAVING REDUCED INTERFACE DEFECT DENSITY

BACKGROUND

The present invention relates in general to semiconductor device fabrication methods and resulting structures. More specifically, the present invention relates to fabrication methods and resulting structures for passivating a surface of a high mobility semiconductor.

A typical metal oxide semiconductor field effect transistor (MOSFET) includes a channel region formed between source and drain regions. The MOSFET also includes a dielectric material (gate dielectric) and a conductive material (e.g., metal) overlying the channel region. MOSFETs and other semiconductor devices are typically formed from semiconductor material. Germanium, III-V compound semiconductors, and other high mobility semiconductors are selected for use in the fabrication of semiconductor devices because of their relatively high carrier mobility. High mobility metal oxide semiconductor field effect transistors (MOSFETs) and other high mobility device architectures formed using these high mobility semiconductor materials provide some increased performance, reduced power consumption, and higher breakdown fields over similar devices formed with lower-mobility semiconductor materials.

SUMMARY

According to one or more embodiments of the present invention, a method of passivating a surface of a high-mobility semiconductor is provided. In some non-limiting embodiments, the method includes forming a semiconductor layer on a substrate. The method further includes contacting a surface of the semiconductor layer with a sulfur source including thiourea ($SC(NH_2)_2$) at a temperature of up to about 90 degrees Celsius to form a sulfur passivation layer on the surface of the semiconductor layer. The method further includes forming a dielectric layer on the sulfur passivation layer. A minimum interface trap density distribution at an interface between the semiconductor layer and the dielectric layer is less than about $2.0 \times 10^{11}$ $cm^{-2}$ $eV^{-1}$.

According to one or more embodiments of the present invention, a method of passivating a surface of a high-mobility semiconductor is provided. In some non-limiting embodiments, the method includes forming an $In_{0.53}Ga_{0.47}As$ layer on a III-V semiconductor substrate. The method further includes mixing an aqueous sulfur source including thiourea with a base solution including $OH^-$ to form a passivating solution and contacting a surface of the $In_{0.53}Ga_{0.47}As$ layer with the passivating solution at a temperature of about 20 to about 100 degrees Celsius to form a sulfur passivation layer on the surface of the $In_{0.53}Ga_{0.47}As$ layer. The method further includes forming a dielectric layer including $Al_2O_3$ on the sulfur passivation layer. A minimum interface trap density at an interface between the $In_{0.53}Ga_{0.47}As$ layer and the dielectric layer is less than about $2.0 \times 10^{11}$ $cm^{-2}$ $eV^{-1}$.

According to one or more embodiments of the present invention, a high-mobility semiconductor structure having a reduced interface trap density is provided. In some non-limiting embodiments, the structure includes an $In_xGa_{1-x}As$ layer formed on a III-V semiconductor substrate, where x is greater than about 0.01 and less than about 0.99. A surface of the $In_xGa_{1-x}As$ layer is passivated with an aqueous sulfur source including thiourea at a temperature of about 20 to about 100 degrees Celsius. A dielectric layer including $Al_2O_3$ is formed on the sulfur passivation layer. A minimum interface trap density at an interface between the $In_xGa_{1-x}As$ layer and the dielectric layer is less than about $2.0 \times 10^{11}$ $cm^{-2}$ $eV^{-1}$.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
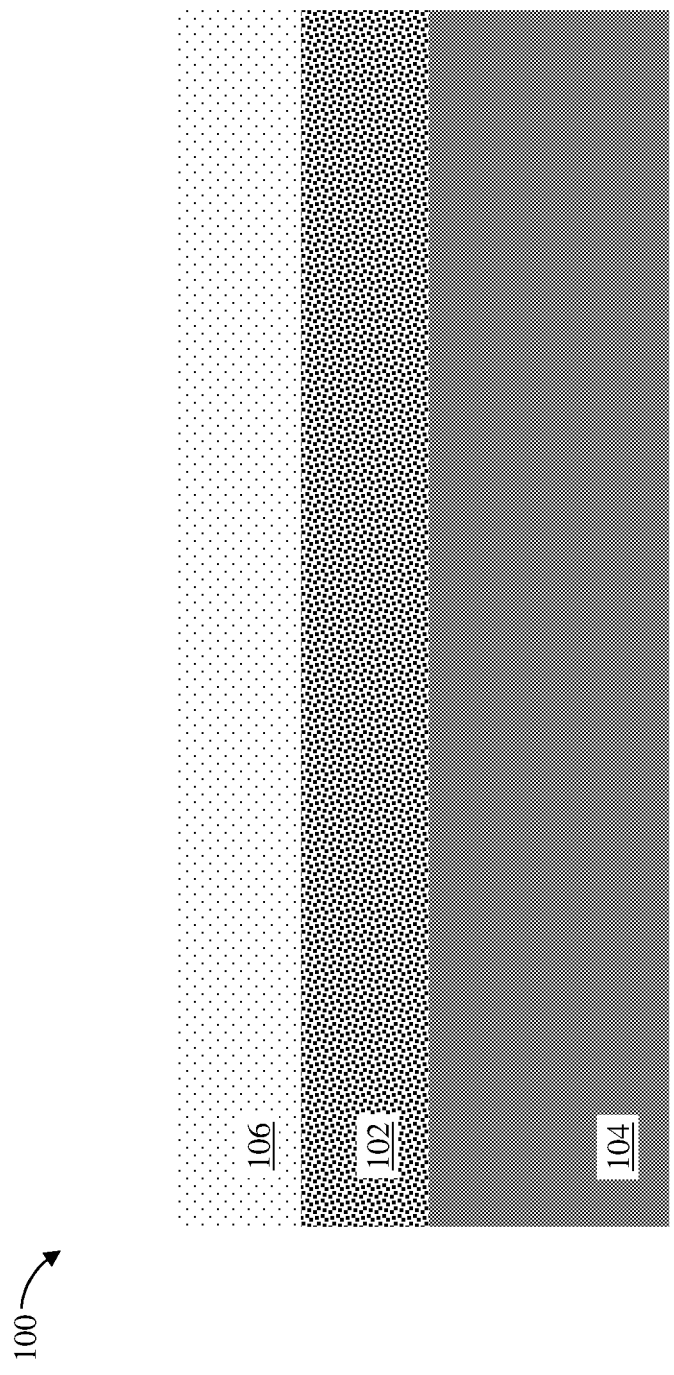
FIG. 1 depicts a cross-sectional view of a structure having a semiconductor layer formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" (e.g., a conformal layer) means that the thickness of the layer is substantially the same on all surfaces, or that the thickness variation is less than 15% of the nominal thickness of the layer.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by introducing proper chemical elements (e.g., dopants) to transistor sources and drains, generally by diffusion and/or by ion implantation methods. These doping processes are followed by furnace annealing or by rapid thermal annealing (RTA). Annealing serves to activate and/or to re-distribute the introduced dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be locally changed. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, as previously noted herein, high carrier mobility device architectures such as III-V semiconductor-based MOSFET devices offer several advantages over lower-mobility semiconductor devices. There are challenges, however, in providing high mobility architectures for scaling beyond the 10 nm node. For example, the interface between the channel region of a high mobility material-based MOSFET and the gate dielectric material can be subject to a large interface trap density (i.e., an interface defect density greater than about $3\times10^{12}$ $cm^{-2}$ $eV^{-1}$). Large interface defect densities are especially prevalent at the semiconductor-high-k gate dielectric interface. There are two primary sources of these excess interface trap densities. The first source of defects is lattice mismatching (i.e., lattice strain) resulting from the difference between the crystal lattice structures of III-V semiconductor and high-k dielectric materials. This strain can induce the formation of dangling bonds and vacancies at the surface of the high mobility semiconductor material. The second source of defects is due to chemistry differences between the III-V and high-k dielectric materials (e.g., differences in the number of valence electronics in the respective materials).

Large interface trap densities negatively impact the performance of semiconductor devices formed with high mobility materials. Consequently, surface passivation of high mobility materials (e.g., III-V compound semiconductors) to reduce the severity of interface trap densities is critical to device performance. Conventional sulfur-based approaches to passivate a high mobility semiconductor surface prior to dielectric deposition have been tried with some success. Sulfur-based passivation processes are ideally high pH, high temperature processes suitable to surface sulfurization reactions. For example, III-V semiconductor materials passivated with sulfur by immersing the materials in wet chemical ammonium sulfide $(NH_4)_2S$ solutions have shown improved interface properties, resulting in some improvement to device performance. There are drawbacks, however, to ammonium sulfide based passivation techniques, such as the decomposition of ammonium sulfide at room temperature, the offensive smell of the ammonium sulfide-based process, and the impracticality of increasing the ammonium sulfide solution temperature. Moreover, conventional ammonium sulfide-based passivation processes provide only modest reductions in interface trap density. Surface passivation of $In_xGa_{1-x}As$ (x~0.53) using ammonium sulfide, for example, results in an interface trap density typically greater than about $3\times10^{12}$ $cm^{-2}$ $eV^{-1}$. Thus, a method is desired for further reducing interface trap densities in high mobility based semiconductor devices.

Turning now to an overview of the aspects of the present invention, one or more embodiments provide methods of passivating a surface of a high mobility semiconductor. A thiourea solution is mixed with a base solution (e.g., ammonium hydroxide or other base solutions forming OH⁻ radicals). Thiourea $(SC(NH_2)_2)$ acts as a sulfur source through the reaction:

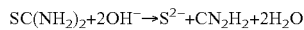

The solution can be heated to a temperature of up to about 90 degrees Celsius to promote sulfurization at the $In_xGa_{1-x}As$ surface. A nanometer-scale thickness supplemental passivation layer (e.g., a-Si, GGO, ZnS, CdS) can be deposited on the sulfur-passivated structure. A dielectric layer (e.g., $Al_2O_3$) can be deposited over the passivation layers and the structure can be annealed using reactive precursors. In some embodiments, the structure can be annealed under hydrogen forming gas ambient conditions to achieve an interface trap density with a minimum of about $2\times10^{11}$ $cm^{-2}$ $eV^{-1}$.

Example methods for passivating a surface of a high mobility semiconductor and the resulting structures therefrom in accordance with embodiments of the present invention are described in detail below by referring to the accompanying drawings in FIGS. 1-6.

FIG. 1 illustrates a cross-sectional view of a structure 100 having a semiconductor layer 102 formed on a substrate 104 during an intermediate operation of a method of fabricating a semiconductor device according to one or more embodiments. In some embodiments, the semiconductor layer 102 is a high mobility semiconductor. The high mobility semiconductor can be any suitable material, such as, for example, InGaAs or other III-V compound semiconductor. In some embodiments, the semiconductor layer 102 is $In_xGa_{1-x}As$, where x is about 0.01 to about 0.99. In some embodiments, the semiconductor layer 102 is $In_xGa_{1-x}As$, where x is about 0.53. In some embodiments, the semiconductor layer 102 has a thickness of about 4 nm to about 150 nm, although other thicknesses are within the contemplated scope of the invention. In some embodiments, a native oxide layer 106 is formed on a surface of the semiconductor layer 102.

The substrate 104 can be any suitable substrate material, such as, for example, indium phosphide (InP), monocrystalline Si, SiGe, SiC, III-V compound semiconductor, II-VI compound semiconductor, or semiconductor-on-insulator (SOI). In some embodiments, the substrate 104 includes a buried oxide layer (not depicted). In some embodiments, the substrate 104 includes both an nFET region and a pFET region. In some embodiments, the substrate 104 includes either an nFET region or a pFET region.

In some embodiments, the semiconductor layer 102 is epitaxially grown on a surface of the substrate 104 and doped to form source/drain regions (not depicted). For example, in some embodiments the semiconductor layer 102 is $In_xGa_{1-x}As$, the substrate 104 is InP, and the $In_xGa_{1-x}As$ layer is epitaxially grown over the InP substrate. The semiconductor layer 102 can be doped using a variety of methods, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, the semiconductor layer 102 includes epitaxial semiconductor materials grown from gaseous or liquid precursors. In some embodiments, epitaxial regions are epitaxially grown from a surface of the substrate 104. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., boron or gallium). The dopant concentration in the semiconductor layer 102 can be greater than $10^{16}$ $cm^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Figure 2:
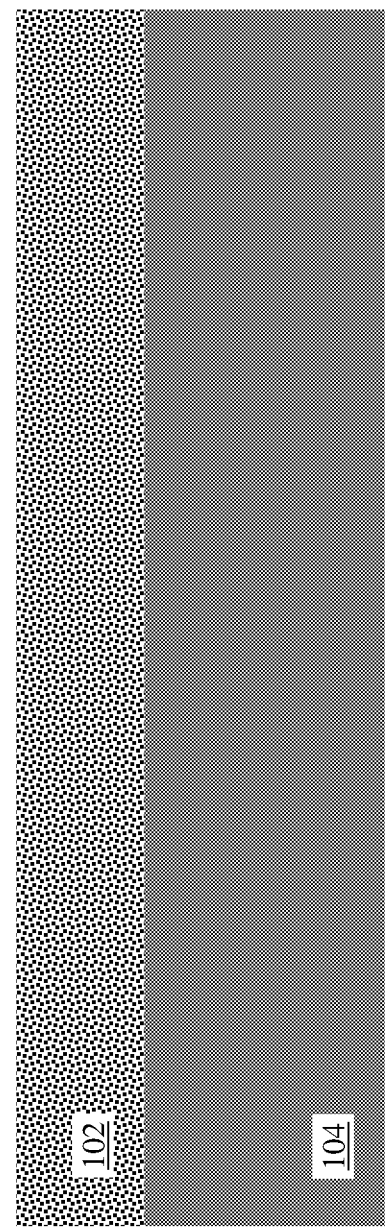
FIG. 2 depicts a cross-sectional view of the structure after removing a native oxide layer from a surface of the semiconductor layer during an intermediate operation of a method of fabricating a semiconductor device according to one or more embodiments of the present invention.

FIG. 2 illustrates a cross-sectional view of the structure 100 after removing the native oxide layer 106 from a surface of the semiconductor layer 102 during an intermediate operation of a method of fabricating a semiconductor device according to one or more embodiments. The native oxide layer 106 can be removed using any known process, such as, for example, a wet etch, a dry etch, or a solid, liquid, or gas phase cleaning source. The cleaning source (e.g., etchant) can be, for example, HCl, HF, $NH_4OH$, $H_2$, or $H_2$ plasma. In some embodiments, the semiconductor layer 102 is InGaAs and the native oxide layer 106 is removed using an HCl etch selective to the semiconductor layer 102. In some embodiments, the semiconductor layer 102 is $In_xGa_{1-x}As$ and the native oxide layer 106 is removed using an aqueous solution of thiourea and a base (e.g., ammonium hydroxide). In some embodiments, the aqueous solution of thiourea and a base is used to both remove the native oxide layer 106 and to form a sulfur passivation layer 300 (as depicted in FIG. 3).

Figure 3:
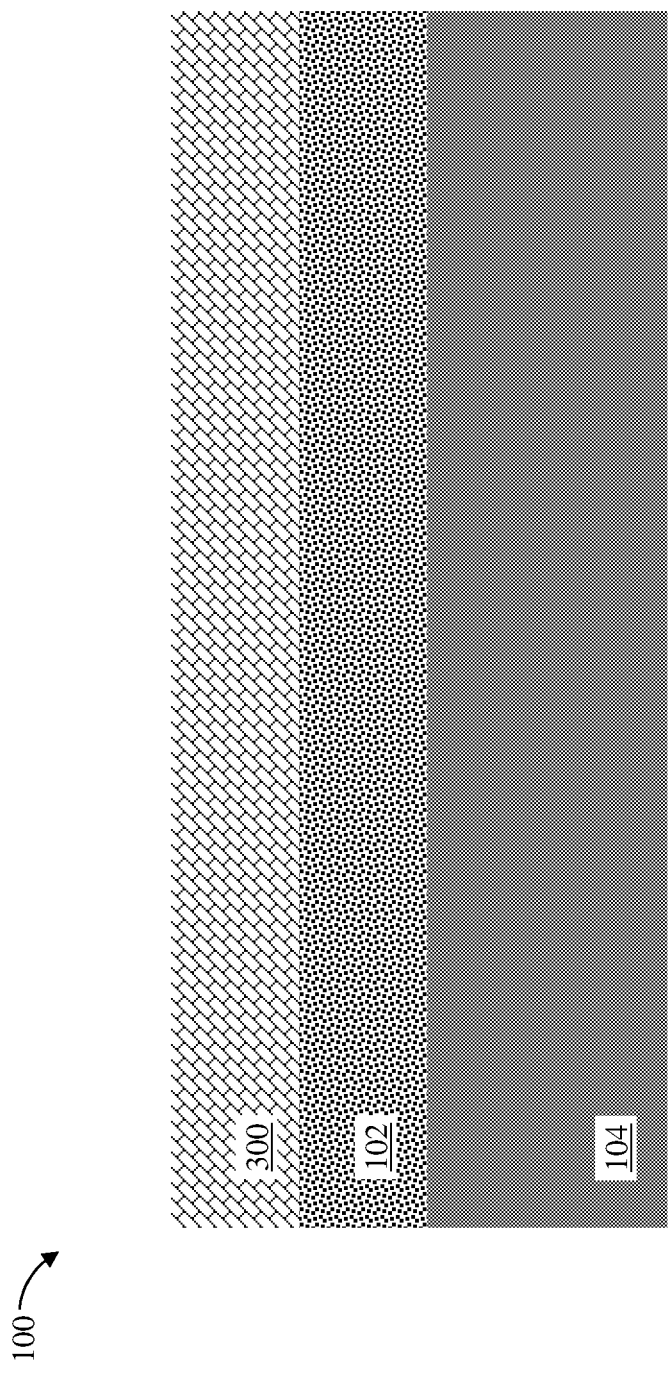
FIG. 3 depicts a cross-sectional view of the structure after forming a sulfur passivation layer on a surface of the semiconductor layer during an intermediate operation of a method of fabricating a semiconductor device according to one or more embodiments of the present invention.

FIG. 3 illustrates a cross-sectional view of the structure 100 after forming a sulfur passivation layer 300 on a surface of the semiconductor layer 102 during an intermediate operation of a method of fabricating a semiconductor device according to one or more embodiments. In some embodiments, a surface of the semiconductor layer 102 is treated with thiourea. In some embodiments, the semiconductor layer 102 is immersed in an aqueous solution including thiourea. In some embodiments, the aqueous solution can include a mixture of thiourea and a base solution (forming, i.e., a passivating solution). The base solution can be, for example, ammonium hydroxide or other base solutions forming $OH^-$ radicals.

As discussed previously herein, thiourea acts as a sulfur source during the passivation process. In some embodiments, the aqueous solution can be heated to a temperature up to about 90 degrees Celsius to promote sulfurization at the surface of the semiconductor 102 layer. In some embodiments, the aqueous solution is heated to a temperature of less than about 100 degrees Celsius to prevent the thiourea from boiling. The passivation process conditions can vary according to a number of factors, including, for example, substrate size, substrate type, prior substrate processing steps, reactor size, reactor type, and the sulfur precursor. The sulfur passivation layer 300 acts to reduce the severity of the interface trap density between the semiconductor layer 102 and the dielectric layer 500 (as depicted in FIG. 5).

Figure 4:
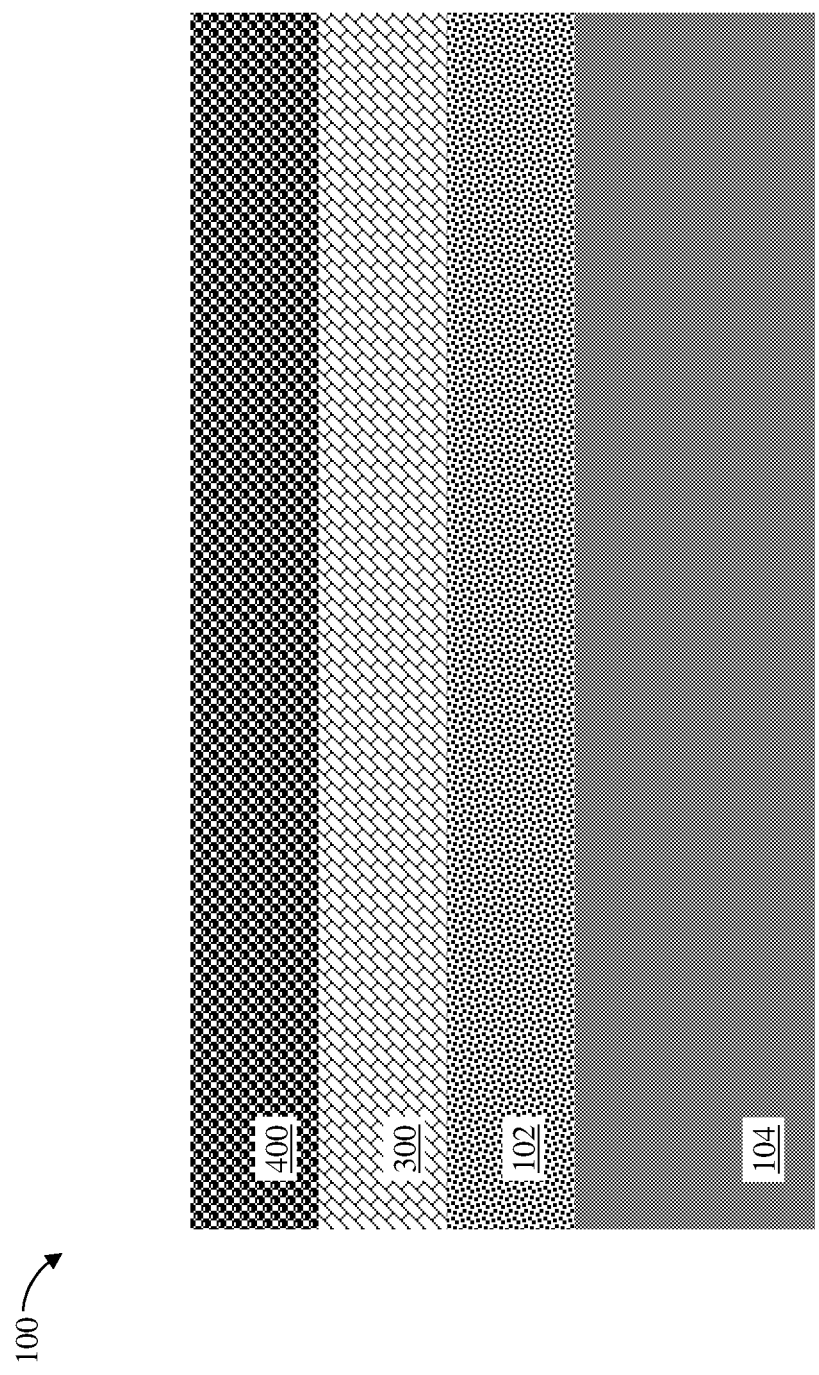
FIG. 4 depicts a cross-sectional view of the structure after forming a second passivation layer on the sulfur passivation layer during an intermediate operation of a method of fabricating a semiconductor device according to one or more embodiments of the present invention.

FIG. 4 illustrates a cross-sectional view of the structure 100 after forming a second passivation layer 400 on the sulfur passivation layer 300 during an intermediate operation of a method of fabricating a semiconductor device according to one or more embodiments. In some embodiments, the second passivation layer 400 is a nanometer-scale thin passivation layer having a thickness of about 1 nm to about 5 nm. The second passivation layer 400 can be formed using any suitable process, such as, for example, CVD, PECVD, ALD, PVD, chemical solution deposition, or other like processes. The second passivation layer 400 further reduces the severity of the interface trap density between the semiconductor layer 102 and the dielectric layer 500 (as depicted in FIG. 5). The second passivation layer 400 can be any suitable material, such as, for example, a-Si, $Ga_2O_3$ ($Gd_2O_3$) (GGO), ZnS, and CdS.

Figure 5:
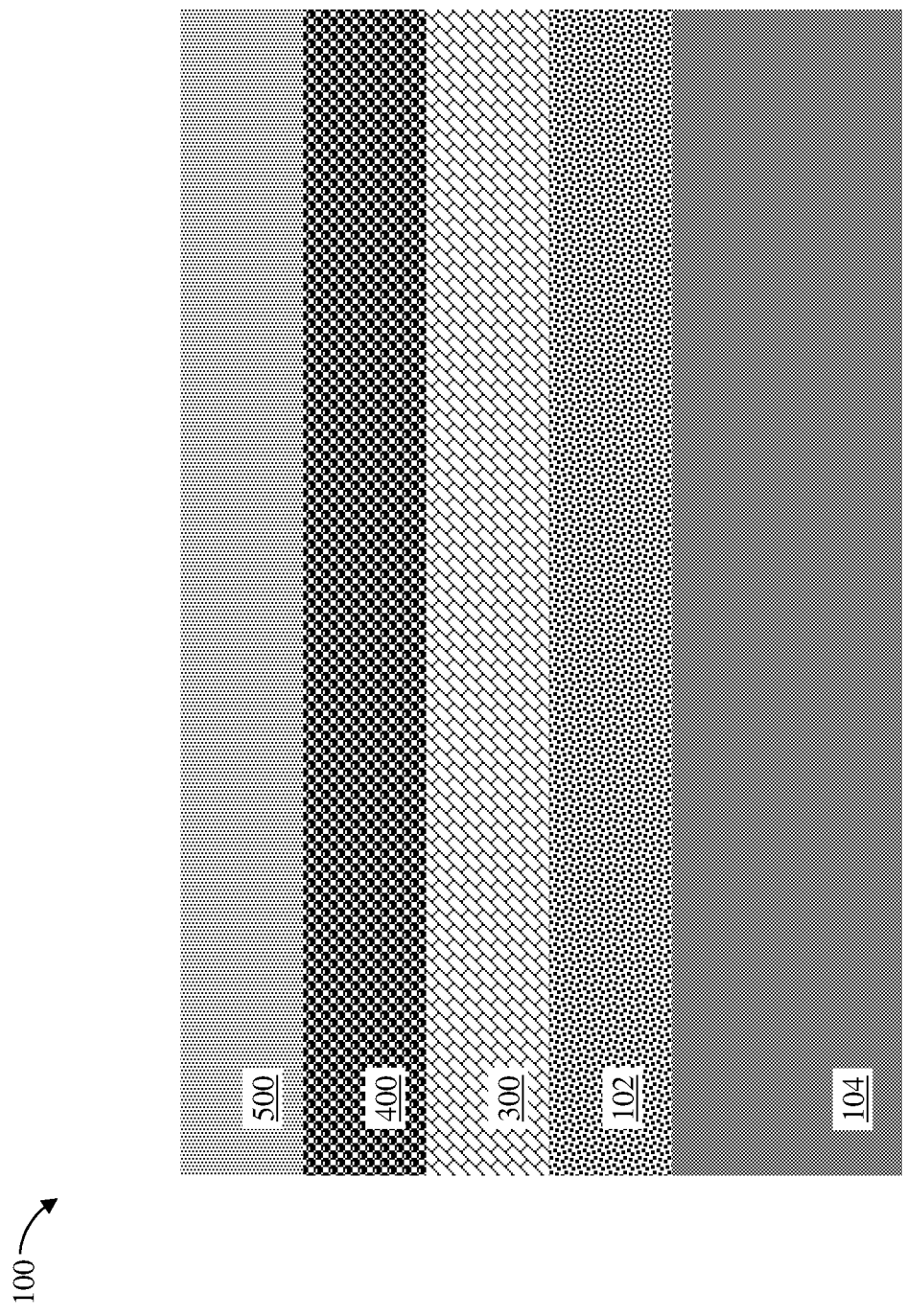
FIG. 5 depicts a cross-sectional view of the structure after forming a dielectric layer on the second passivation layer during an intermediate operation of a method of fabricating a semiconductor device according to one or more embodiments of the present invention.

FIG. 5 illustrates a cross-sectional view of the structure 100 after forming a dielectric layer 500 on the second passivation layer 400 during an intermediate operation of a method of fabricating a semiconductor device according to one or more embodiments. In some embodiments, the second passivation layer 400 is not formed and the dielectric layer 500 is formed on the sulfur passivation layer 300. The dielectric layer 500 can be, for example, aluminium oxide, silicon oxide, silicon nitride, silicon oxynitride, boron nitride, high-k materials, or any combination of these materials. In some embodiments, the dielectric layer 500 includes one or more dielectric layers each having a dielectric constant greater than about 2.5. Examples of high-k materials include but are not limited to metal oxides such as hafnium oxide, hafnium silicon oxide, hafnium silicon oxynitride, lanthanum oxide, lanthanum aluminium oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminium oxide, lead scandium tantalum oxide, and lead zinc niobate. The high-k materials can further include dopants such as lanthanum and aluminum. The dielectric layer 500 can have a thickness of about 0.5 nm to about 25 nm. In some embodiments, the dielectric layer 500 can have a thickness of about 12 nm, although other thicknesses are within the contemplated scope of the invention.

The dielectric layer 500 can be formed using known processes, such as, for example, CVD, PECVD, ALD, PVD, chemical solution deposition, or other like processes. In some embodiments, the dielectric layer 500 is deposited and annealed using known annealing processes, such as, for example, RTA, hot-gas annealing, or isothermal annealing. Annealing can be before, during, or after forming the dielectric layer 500. In some embodiments, a forming gas annealing (FGA) process is used to form and anneal the dielectric layer 500. The FGA process can further reduce the interface trap density between the semiconductor layer 102 and the dielectric layer 500. In some embodiments, the semiconductor layer 102 is InGaAs, the dielectric layer 500 is $Al_2O_3$, and the pre-annealing interface defect density between the semiconductor layer 102 and the dielectric layer 500 is about $2 \times 10^{12}$ $cm^{-2}$ $eV^{-1}$. In some embodiments, the FGA process uses carrier gas at a temperature of about 350 degrees Celsius to achieve a minimum interface trap density of about $5.8 \times 10^{11}$ $cm^{-2}$ $eV^{-1}$. In some embodiments, the FGA process uses carrier gas at a temperature of about 390 degrees Celsius to achieve a minimum interface trap density of about $2 \times 10^{11}$ $cm^{-2}$ $eV^{-1}$. In some embodiments, the structure 100 is annealed for about 30 minutes, although other durations are within the contemplated scope of the invention. The carrier gas can be any suitable carrier gas, such as, for example, hydrogen, deuterium, nitrogen, argon, helium, or a combination thereof. In some embodiments, the carrier gas is hydrogen.

Figure 6:
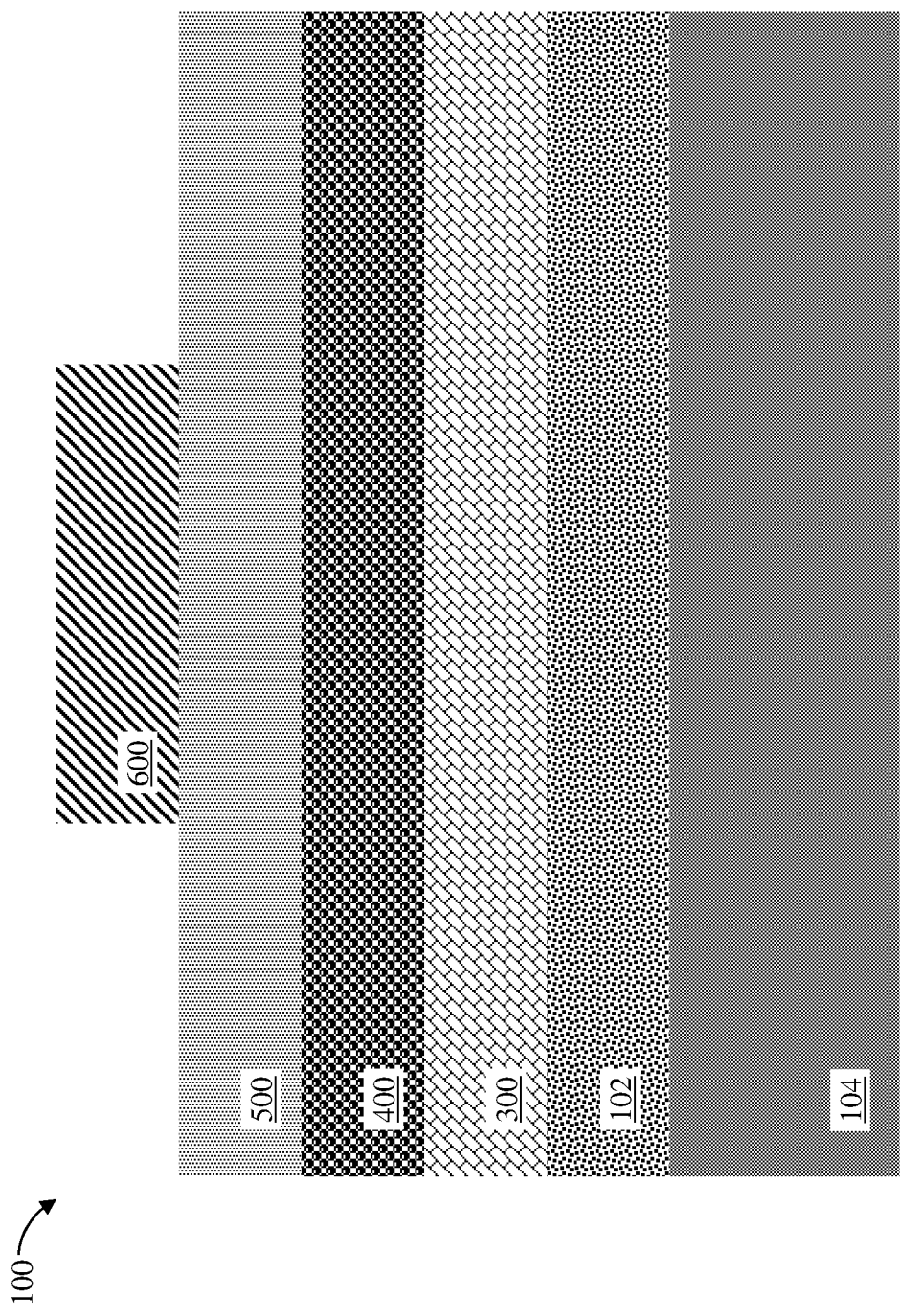
FIG. 6 depicts a cross-sectional view of the structure after forming a conductive layer on the dielectric layer during an intermediate operation of a method of fabricating a semiconductor device according to one or more embodiments of the present invention.

FIG. 6 illustrates a cross-sectional view of the structure 100 after forming a conductive layer 600 on the dielectric layer 500 during an intermediate operation of a method of fabricating a semiconductor device according to one or more embodiments. In this manner, the structure 100 serves as a capacitor. The conductive layer 600 can be of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method of passivating a surface of a semiconductor, the method comprising:
   forming a semiconductor layer on a substrate;
   contacting a surface of the semiconductor layer with a sulfur source comprising thiourea at a temperature of up to about 90 degrees Celsius to form a sulfur passivation layer on the surface of the semiconductor layer;
   forming a dielectric layer on the sulfur passivation layer; and
   annealing the dielectric layer at a temperature of about 350 degrees Celsius for about 30 minutes;
   wherein a minimum interface trap density distribution at an interface between the semiconductor layer and the dielectric layer is less than about $5.8 \times 10^{11}$ cm$^{-2}$ eV$^{-1}$.

2. The method of claim 1 further comprising removing a native oxide layer from the surface of the semiconductor layer prior to contacting the surface of the semiconductor layer with the sulfur source.

3. The method of claim 1 further comprising forming a second passivation layer between the sulfur passivation layer and the dielectric layer, the second passivation layer selected from the group consisting of a-Si, Ga$_2$O$_3$(Gd$_2$O$_3$) (GGO), ZnS, and CdS.

4. The method of claim 1 further comprising forming a conductive layer on a portion of the dielectric layer.

5. The method of claim 1, wherein the semiconductor layer comprises a high-mobility III-V compound semiconductor and the dielectric layer comprises a high-k dielectric having a dielectric constant greater than about 2.5.

6. The method of claim 5, wherein the semiconductor layer comprises In$_{0.53}$Ga$_{0.47}$As; and wherein the dielectric layer comprises Al$_2$O$_3$.

7. A method of passivating a surface of a semiconductor, the method comprising:
   forming an In$_{0.53}$Ga$_{0.47}$As layer on a III-V semiconductor substrate;
   mixing an aqueous sulfur source comprising thiourea with a base solution comprising OH$^-$ to form a passivating solution;
   contacting a surface of the In$_{0.53}$Ga$_{0.47}$As layer with the passivating solution at a temperature of up to about 90 degrees Celsius to form a sulfur passivation layer on the surface of the In$_{0.53}$Ga$_{0.47}$As layer; and
   forming a dielectric layer comprising Al$_2$O$_3$ on the sulfur passivation layer;
   wherein a minimum interface trap density distribution at an interface between the In$_{0.53}$Ga$_{0.47}$As layer and the dielectric layer is less than about $2.0 \times 10^{12}$ cm$^{-2}$ eV$^{-1}$.

8. The method of claim 7 further comprising annealing the dielectric layer at a temperature of about 350 degrees Celsius for about 30 minutes; wherein the minimum interface trap density distribution at the interface between the In$_{0.53}$Ga$_{0.47}$As layer and the dielectric layer is about $5.8 \times 10^{11}$ cm$^{-2}$ eV$^{-1}$.

9. The method of claim 7 further comprising annealing the dielectric layer at a temperature of about 390 degrees Celsius for about 30 minutes; wherein the minimum interface trap density distribution at the interface between the In$_{0.53}$Ga$_{0.47}$As layer and the dielectric layer is about $2 \times 10^{11}$ cm$^{-2}$ eV$^{-1}$.

10. The method of claim 7 further comprising forming a second passivation layer between the sulfur passivation layer and the dielectric layer, the second passivation layer selected from the group consisting of a-Si, Ga$_2$O$_3$(Gd$_2$O$_3$) (GGO), ZnS, and CdS.

11. The method of claim 7 further comprising forming a conductive layer comprising aluminum on a portion of the dielectric layer.

12. A semiconductor device comprising:
   an In$_x$Ga$_{1-x}$As layer formed on a III-V semiconductor substrate, a surface of the In$_x$Ga$_{1-x}$As layer passivated with an aqueous sulfur source comprising thiourea at a temperature of up to about 90 degrees Celsius; and
   a dielectric layer comprising Al$_2$O$_3$ formed on the sulfur passivation layer;
   wherein a minimum interface defect density distribution at an interface between the In$_x$Ga$_{1-x}$As layer and the dielectric layer is about $2.0 \times 10^{11}$ cm$^{-2}$ eV$^{-1}$;
   wherein x is greater than about 0.01 and less than about 0.99.

13. The semiconductor device of claim 12, wherein the III-V semiconductor substrate comprises InP.

14. The semiconductor device of claim 12, wherein x is 0.53.

15. The semiconductor device of claim 12 further comprising a second passivation layer formed between the sulfur passivation layer and the dielectric layer, the second passivation layer selected from the group consisting of a-Si, Ga$_2$O$_3$(Gd$_2$O$_3$) (GGO), ZnS, and CdS.

16. The semiconductor device of claim 12 further comprising a conductive layer comprising Al formed on a portion of the dielectric layer.

* * * * *